United States Patent [19]

Storm

[11] 4,167,746

[45] Sep. 11, 1979

[54] RADIATION TRIGGERED THYRISTOR WITH LIGHT FOCUSSING GUIDE

[75] Inventor: Herbert F. Storm, Delmar, N.Y.

[73] Assignee: General Electric Company, Schenectady, N.Y.

[21] Appl. No.: 555,057

[22] Filed: Mar. 3, 1975

[51] Int. Cl.² .................. H01L 27/14; H01L 31/00
[52] U.S. Cl. ........................................ 357/30; 357/38; 357/86; 350/96.10; 350/96.20; 350/96.28
[58] Field of Search ............... 357/30, 38, 39, 86; 350/96 T, 96 WG

[56] References Cited

U.S. PATENT DOCUMENTS

| | | | |
|---|---|---|---|
| 3,526,801 | 9/1970 | Kruse | 357/30 |
| 3,590,344 | 6/1971 | Roberts et al. | 357/38 |
| 3,697,833 | 10/1972 | Nakata | 357/38 |
| 3,704,376 | 11/1972 | Lehovec et al. | 357/30 |
| 3,719,863 | 3/1973 | Ogawa et al. | 357/38 |
| 3,893,153 | 7/1975 | Page et al. | 357/30 |
| 3,896,476 | 7/1975 | Kawakami | 357/38 |

Primary Examiner—Joseph E. Clawson, Jr.
Attorney, Agent, or Firm—Mark P. Kahler; Joseph T. Cohen; Marvin Snyder

[57] ABSTRACT

A monolithic semiconductor switch for triggering from a light source or from an electrical signal is provided which includes a light sensitive gate region, and one or more amplifying gate thyristor regions adapted to be connected to an electrical triggering source. Where light triggering is desired, the turn on characteristics of the device are improved by providing light focussing on the light sensitive gate area.

14 Claims, 4 Drawing Figures

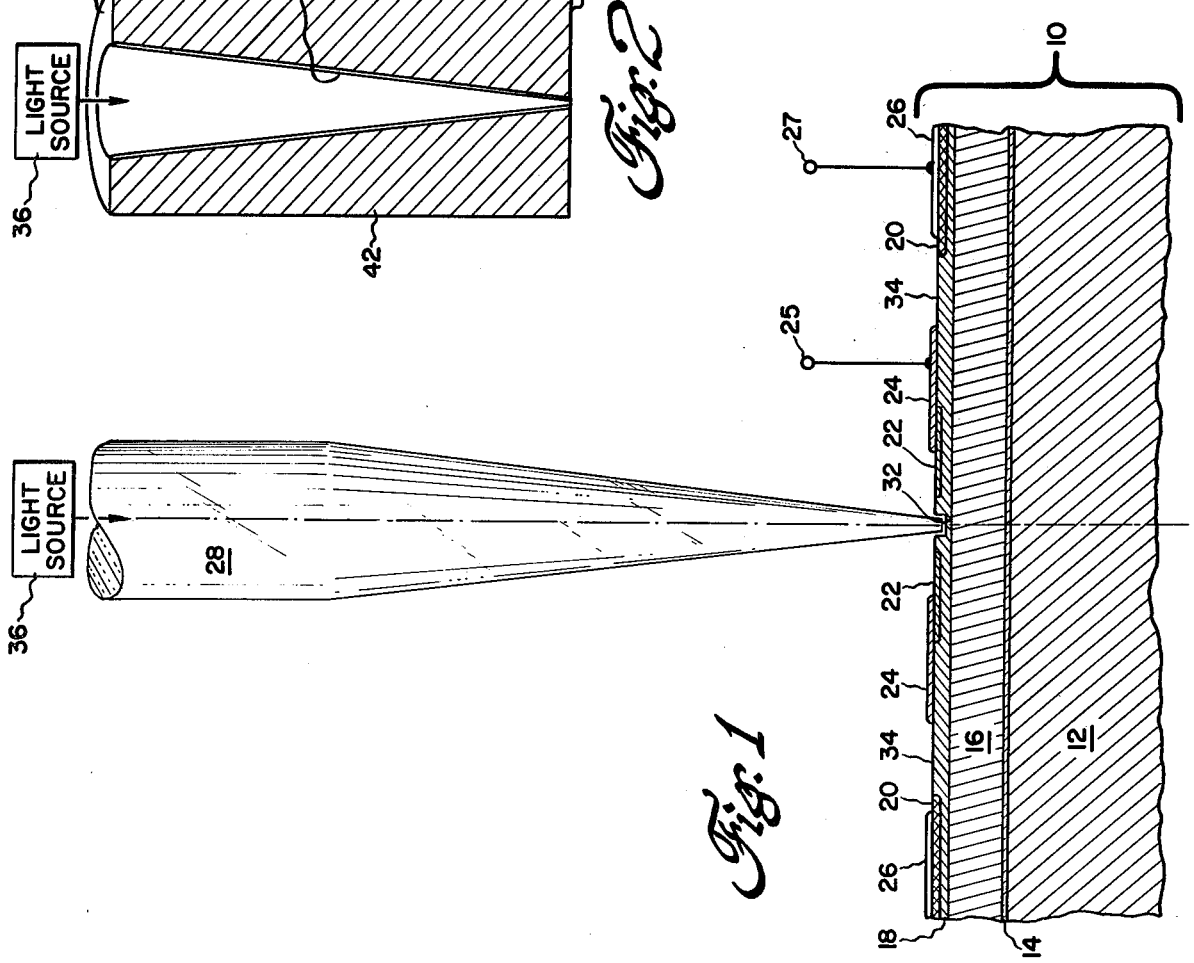

RADIATION TRIGGERED THYRISTOR WITH LIGHT FOCUSSING GUIDE

This invention relates, in general, to semiconductor switches and, for specifically to radiation triggered semiconductor devices having at least one amplifying gate region and means for concentrating triggering radiation in a small gate area.

Radiation triggered semiconductor switches include a wide variety of devices including, but not limited to, thyristors, sometimes referred to as silicon controlled rectifiers (SCR's), diacs, and triacs. Devices of this type are becoming increasingly important in power conditioning applications where high speed switching and high voltage and current requirements combine to make mechanical or electromechanical switches and commutators, for example, obsolete. A problem in the use of radiation triggered semiconductor switches of the type to which this invention is addressed has been to provide reliable and substantially noise immune triggering in various often times difficult environments. For example, in the case of high voltage direct current transmission line systems, where many semiconductor switches must be connected in series to achieve the required voltage breakdown characteristics, direct electrical triggering presents insulation problems in that the various gate terminals must be isolated from each other and from ground due to the high voltages present thereon with respect to ground. Applications where extremely high levels of electromagnetic noise are present, as for example, large industrial installations or locomotives, present a problem in that spurious triggering of the devices may occur due to the noise level. Radiation triggered semiconductor switches of the type to which this invention is addressed provide satisfactory solutions to a number of these problems. For example, it can be seen that a plurality of series connected semiconductor switches as might be necessary in order to switch a high voltage d.c. signal may be easily triggered by a radiation source, as for example, light, without the insulation problems present in the case of direct electrical triggering. The relative immunity of radiation triggered devices to electromagnetic noise makes them well suited to applications where noise considerations may have heretofore rendered direct electrically triggered semiconductor switches unsatisfactory.

Developments in light generation and transmission, especially the development of light generating semiconductor devices and fiber optic light transmissive mediums have resulted in increased interest in radiation triggered semiconductor switches. Radiation triggered semiconductor switches are not without their limitations. For example, "turn-on" of radiation triggered semiconductor devices is initiated by the creation of electron-hole pairs by light impinging upon the gate area of the device. The concentration of electron-hole pairs created will depend on a number of considerations including, but not limited to, gate area exposed to the source of radiation, the structure of the gate area, and the intensity and wavelength of the radiation. In order to create a device having sufficient sensitivity to triggering radiation to enable large currents to be controlled, it is necessary that a large number of electron-hole pairs be created by the available triggering radiation. All other considerations being equal, it is therefore necessary to provide a radiation sensitive gate region which increases in size with the increased and current handling capacity of the device. As the area of the gate region increases, however, the device becomes increasingly susceptible to spurious turn-on due, for example, to anode to cathode voltage changes, hereinafter referred to as the dv/dt characteristic. Increased trigger sensitivity may be provided by use of an auxiliary semiconductor switch connected in amplifying circuit relationship with the primary semiconductor switch so that when the auxiliary switch is triggered, it being understood that the sensitivity of the auxiliary switch is higher than that of the primary switch, current flowing through the auxiliary switch is connected to the gate of the primary switch thereby triggering it. Where more gain is needed than can conveniently be provided through the use of a single auxiliary switch, a second auxiliary switch may be utilized in similar circuit relation with said first auxiliary switch as the first auxiliary switch has with the primary switch. The combination of a primary semiconductor switch with one or more auxiliary switches may be accomplished in a variety of ways. For example, the primary and first auxiliary switch may be thyristor devices, that is to say devices having four semiconductor layers while the light triggered switch is a photosensitive transistor. The primary, secondary and any additional semiconductor switches as hereinabove described may be fabricated as discrete devices connected together by current carrying conductors, or they may be formed as a single semiconductor device having certain elements in common. One form of multistaged semiconductors which, as described, is commonly referred to as the amplifying gate structure. This structure comprises, in the thyristor configuration, a four-layer device embodying at least two thyristors, a main thyristor and an auxiliary thyristor, the main thyristor adapted to be triggered by the auxiliary thyristor. Generally, three semiconductor layers are shared by the two devices, and distinct gate regions are provided. The aforementioned dv/dt characteristic may be most easily understood by considering the structure of a four layer amplifying gate device. It is to be understood that while a pnpn device will be described, the particular selection of p-type and n-type semiconductor layers must be reversed in order to obtain the complementary structure. A pnpn type device is conventionally connected with a positive potential existing between the p layer and the n layer which comprise the extremes of the device. It can be seen that three semiconductor junctions exist, beginning first with the p layer a p-n junction, followed by an n-p junction, and finally followed by a second p-n junction. The first p-n junction will be forward biased, the second junction, the n-p junction will be reverse biased, and the final p-n junction will be again forward biased. A depletion region will be formed at the reverse biased n-p junction which depletion region is characterized by a capacitance associated therewith. It can be easily visualized therefore, that when a rapid change of voltage with respect to time occurs between the terminals of the device that a quantity of charge proportional to the rate of change of voltage with respect to time and the depletion capacitance hereinabove described will be injected into the third layer of the device, that is to say the second p-type layer tending to turn the device on. It can be seen that, assuming that for a moment that relatively little can be done to diminish the changes of terminal voltage of the device with respect to time, that the area of the reverse biased n-p junction will be the determining factor as to the dv/dt characteristics of the device.

Consideration of the dv/dt characteristic of a two stage semiconductor switch, that is a switch having at least one auxiliary semiconductor section in combination with a main semiconductor section, wherein the main semiconductor section is a four layer thyristor device and the auxiliary semiconductor section is a photosensitive three layer, transistor, device, clearly illustrates the problem. The dv/dt characteristic of the main thyristor may be improved, that is to say that the ability to withstand rapid changes in anode to cathode voltage may be increased, by the use of a shorted emitter construction under the cathode contact. The shorted emitter technique is not applicable, however, to the auxiliary transistor section and it is to the improvement of the dv/dt characteristic of this section in combination with a thyristor device of the type hereinbelow more particularly described that this invention is addressed.

Briefly stated, and in accordance with one aspect of this invention, a semiconductor switch is provided having a first semiconductor portion including first and second terminals adapted to control the flow of the power therebetween, and a control terminal; a second semiconductor portion connected in amplifying gate relationship with the first semiconductor portion, the second semiconductor portion having a light sensitive gate region so that when light impinges on the gate area of the second semiconductor portion is rendered conductive thereby rendering the first semiconductor portion conductive. Means are provided for converging light from a light source onto the light sensitive gate area of the second semiconductor portion.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a section view of a light triggered semiconductor switch in accordance with one aspect of this invention.

FIG. 2 is a section view of an alternative light converging device.

FIG. 3 is a section view of yet another alternative light converging device.

FIG. 4 is a partial section view of a semiconductor device in accordance with one aspect of this invention including mounting means therefore.

Referring now to FIG. 1 there is shown a section view of a light triggered thyristor in accordance with this invention. The thyristor, designated generally at 10, is constructed on a conductive base 12 which forms one electrical contact of the thyristor and, in addition, provides a thermal contact for the transfer of heat from the device. This contact may conveniently be made of a metal, as for example, but not limited to aluminum on tungsten. It is to be understood that FIG. 1 shows only a portion a semiconductor switch in accordance with this invention, and that for purposes of reducing the size of the drawing only the center portion of the device is shown. It is to be understood, therefore, that an actual device would extend laterally in both directions beyond that portion shown in FIG. 1. A first semiconductor layer 14 overlies one surface of base 12. For purposes of example, a device in accordance with FIG. 1 will be assumed to be a pnpn device, it being understood that the complementary structure is also suitable. Accordingly, first semiconductor layer 14 will be assumed in this embodiment to be a p doped semiconductor layer. Overlying p doped layer 14 is n type doped semiconductor layer 16. As is well known, these layers may conveniently be fabricated of silicon and formed by any well known method as, for example, epitaxial growth or diffusion. Overlying n type doped layer 16 is a second p type doped layer 18. It is to be noted that p type doped layer 18 provides a relatively great lateral resistance which lateral resistance substantially isolates laterally spaced apart sections of this semiconductor structure one from the other as will be hereinbelow more completely described. Overlying p type doped layer 18 are two n type doped annular regions 20 and 22. It is to be appreciated that it is convenient to form a semiconductor structure in accordance with this device in generally circular form and therefore that the cross section of FIG. 1 represents a section view taken along a diameter of such a circular wafer. While an embodiment of this invention in circular form is illustrated, it is to be understood that the invention is not so limited. Amplifying gate structures including various shaped projections or lobes are equally applicable and are intended to be embranced by "generally circular shape" or "substantially annular" as used herein. Metallizations 24 and 26 are provided overlying p type doped layer 18 and n type doped regions 20 and 22. Specifically, metallization 24, again an annular shape region, partially overlies n type doped region 22 and p type doped layer 18 providing ohmic contact therebetween. Metallization 26, also an annular shape metallization provides ohmic contact to n type doped region 20. It will be appreciated that metallization 26 is the cathode terminal of the device. Where additional currents gain is required, a semiconductor switch in accordance with this invention may include an additional amplifying gate. In that case n-type doped region 20 performs a like function of n type doped region 22, and a further n-type doped region (not shown) is the cathode of the device.

The pnpn device as hereinabove described will be recognized as an amplifying gate thyristor structure. The main body of the structure will be appreciated to consist of the four layer pnpn structure including layers 14, 16, 18 and annular ring 20. Metallization 26 and conductive base 12 provide the cathode and anode electrical terminals respectively. N type doped region 22 and the portions of p type doped layer 18, n type doped layer 16 and p type doped layer 14 lying thereunder comprise the amplifying gate, or pilot SCR structure. Self-foccusing light guide 28 provides a means for converging light from light source 30 onto light sensitive gate region 32. P-type doped region 18 is sufficiently thin in the area of light sensitive gate region 32 so that it is translucent to light. Conveniently light sensitive region 32 may be formed by etching away a portion of p type doped layer 18 to provide a relatively thin light sensitive gate region. Light sensitive gate region 32 should be sufficiently thin so that sufficient hole-electron pairs are formed at the junction between p type doped layer 18 and n type doped layer 16 under the light sensitive gate region 32. When sufficient hole-electron pairs are formed in the light sensitive gate region, turn-on current flows from anode 12 through semiconductor layers 14, 16 and 18 to n type doped region 22 which region is the cathode of the pnpn portion of the device underlying n type doped region 22. Current from n type doped region 22 is conducted by metallization 24 to gate region 34 of the main pnpn structure. It can be seen that carriers injected into gate region 34 will turn on the main thyristor structure. For purposes of most easily understanding a semiconductor switch in accordance with this invention, the structure illustrated in FIG. 1 has been described as including a main and auxiliary semiconductor structure. It is to be understood that, as illustrated in FIG. 1, no precise physical boundary separates these structures. For purposes of description, the auxiliary thyristor has been described as extending from the centerline of the device to the outside edge of annular n type doped region 22. The annular portion of the device extending from the outside edge of annular n type doped region 22 to the edge of device (not shown) may conveniently be thought of as the main thyristor section. It is to be understood, however, that no such clearly defined boundary exists in an actual device in accordance with this invention. The effects which contribute to the operation of the device, as for example the injection of carriers and the flow of current through the various layers, do not occur in sharply defined regions.

It is to be appreciated that thyristor 10 may conveniently be triggered in an alternative fashion by connecting a voltage to terminals 25 or 27 which may or may not be provided as desired in a particular embodiment of this invention. Clearly terminal 25 provides a gate terminal of relatively high sensitivity, while terminal 27 provides a gate terminal of relatively lower sensitivity. If desired, terminals 25 and 27 may be provided signals, such as turn on or inhibit signals to provide, in combination with the light trigger signals, logical functions, for example "and" or "or" as desired.

As has been hereinbefore described, the dv/dt rating of a device of the type as illustrated in FIG. 1 will depend upon the more or less independently determinable dv/dt ratings of the main SCR section and the pilot SCR section of the device. As is well known, the dv/dt rating of the main SCR section may be conveniently increased through the use of the shorted emitter technique. This technique involves the use of ohmic electrical connections extending from, for example, metallization 26 through n type doped region 20 to p type doped layer 18. The shorted emitter technique increases the dv/dt breakdown voltage by providing low resistance paths for currents created by the depletion capacitance which exists at the junction between n type doped layer 16 and p type doped layer 18.

While the dv/dt breakdown rating of the main thyristor portion of a device of the type illustrated in FIG. 1 may be reduced by the shorted emitter technique, it is clear that this technique is not applicable to the auxiliary thyristor section. It has been found that the dv/dt characteristic of the auxiliary thyristor section is directly related to the light sensitive gate area of the auxiliary thyristor section. For example, a device having a light receiving area of 1 mm$^2$ may exhibit a capacitive junction current at a dv/dt of 100 volts per microsecond which is substantially larger than the trigger current for the auxiliary thyristor and therefore which will turn the thyristor on. In accordance with this invention, the light receiving area is reduced, for example, to 0.03 mm$^2$, that is to say the diameter of light sensitive area is reduced from approximately 1.13 millimeters to 0.2 millimeters. It will be appreciated that the photocurrent generated by a constant intensity light source impinging on the light sensitive area will be reduced as the diameter of the light sensitive area is reduced. It is clear, therefore, that the light intensity must be increased by at least the same factor as the decrease in area. In accordance with one aspect of this invention, therefore, a light focussing guide 28 is provided having at one end thereof a light source 36, and having the other end thereof proximate to the light sensitive gate area 32 of thyristor 10. Light focussing guide 28 may conveniently be a SELFOC ® of the type manufactured for example by Nippon Sheet Glass Company, Ltd., Japan. The SELFOC ® is a tapered light focussing guide of generally conical cross section having an index of refraction which decreases with the radius of the device. In this way a light guide is provided which concentrates light from a relatively large light source as, for example, a light emitting diode onto a relatively smaller light receptive area as, for example, light sensitive gate region 32 of thyristor 10, without the need for expensive and/or difficult to adjust lenses. While the SELFOC ® may be utilized in the preferred embodiment of this invention, it is to be understood that any means for concentrating light from a relatively large light source to the relatively small light sensitive gate region may be used. For example, a conical mirror of the type illustrated in FIG. 2 which includes any first annular surface 38 and a second annular surface 40, surface 38 having a relatively large diameter hole therein while surface 40 has a relatively small diameter hole therein, a generally conical bore extending from surface 38 through the body 42 of the device to second annular surface 40. The interior of the conical bore is provided with a light reflecting surface 44 as, for example, but not limited to by silvering or polishing the surface of the bore. By selecting the ratio of the interior diameters of the large annular surface and the small annular surface along with the length of the device as is well known to one skilled in the art, it is possible to provide a conical mirror which converges substantially all of the light present at the large annular surface into the small circular area of the second annular surface 40. FIG. 3 illustrates in a schematic fashion yet a third method for converging light from a relatively large light source to the relatively small light sensitive gate region of thyristor 10. It is intended that FIG. 3 illustrate any converging lens system as, for example, but not limited to single converging lens or a multiple converging lens system.

It is to be understood that the illustrative light converging devices illustrated in FIGS. 1, 2 and 3 are exemplary only, and no attempt is made to illustrate all light converging methods which may be conveniently utilized in accordance with this invention. It is necessary only to provide means for converging light from a relatively large light source onto the relatively small light sensitive gate region of thyristor 10.

FIG. 4 illustrates a method for mounting a light sensitive thyristor in accordance with this invention. Thyristor 10 is shown physically overlying thermally conductive mounting member 46 which, in turn, overlies base 48 which may conveniently be provided with a threaded portion 50 for mounting as, for example, to a heat sink. Electrical connection is made to the anode of thyristor 10 through thermally conductive mounting member 46 and base 48. Cathode connection to thyristor 10 is made by means of annular contact 52 which makes electrical and thermal contact to annular metallization 26 as shown in FIG. 1. Cathode terminal 54 is connected to annular cathode contacting ring 52 by sleeve 56. Insulating sleeve 58 electrically isolates cathode terminal 54 from anode 48. Light focussing guide 28 extends through cathode terminal 54 and is supported at one end thereof by bushing 60. As illustrated, light focussing guide 28 includes a tapered portion as hereinbefore described in conjunction with FIG. 1, and a non-tapered light transmissive portion extending from bushing 62 light source 36 which non-tapered portion may conveniently be flexible as, for example, a fiber optic light guide.

While this invention has been hereinabove described as applied to a pnpn thyristor structure, it is to be understood that the invention is not so limited. For example, the invention may be readily applied to a five layer bidirectional semiconductor switch of the type well known to one skilled in the art by providing two relatively small light sensitive gate areas and two light converging systems whereby the device may be triggered by either light sensitive gate region to conduct therefore in either direction. Similarly, the amplifying gate structure illustrated in FIG. 1 is equally applicable to a bi-directional semiconductor switch. It is to be further understood that while the thyristor structure of FIG. 1 includes a main thyristor and an auxiliary thyristor connected in amplifying gate circuit relationship therewith, that where necessary additional auxiliary thyristors may be added in amplifying gate relationship with the original auxiliary thyristor as is well known to one skilled in the art. It is possible thereby to provide increased current gain over a single amplifying gate structure. In certain applications it may be desirable to omit completely the auxiliary thyristor and to provide only a main thyristor having a light sensitive gate region. The teachings of this invention are equally applicable thereto and provide a light sensitive thyristor having superior characteristics over those known in the prior art.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A monolithic semiconductor switch adapted to be triggered by a light source comprising:
   a first semiconductor portion having first and second switch terminals and a gate terminal,
   a second semiconductor portion connected in amplifying gate relationship with said first semiconductor portion, said second semiconductor portion having a light sensitive gate area,
   means converging light from said light source onto said light sensitive gate area.

2. The semiconductor switch of claim 1 wherein said first semiconductor portion comprises a thyristor.

3. The semiconductor switch of claim 2 wherein said second semiconductor portion comprises an auxiliary thyristor connected in amplifying gate relationship with said first thyristor.

4. The semiconductor switch of claim 3 wherein said means converging light from said light source onto said light sensitive gate area comprises a self-focussing light guide.

5. The semiconductor switch of claim 3 wherein said means convering light from said light source into said light sensitive gate area comprises a conical mirror.

6. The semiconductor switch of claim 3 further comprising a third semiconductor portion connected in serial amplifying gate relationship with said first and second semiconductor portions for providing additional amplification.

7. A radiation triggered thyristor adapted to be triggered by a light source comprising
   a first semiconductor layer of a first conductivity type,
   a second semiconductor layer of a second conductivity type overlying said first semiconductor layer and forming a semiconductor junction therebetween,
   a third semiconductor layer of said first conductivity type overlying said second semiconductor layer and forming a second semiconductor junction therebetween,
   a fourth semiconductor layer of said second conductivity type, having a substantially annular, shape diffused into said third semiconductor layer towards but not meeting said second semiconductor junction and forming a third semiconductor junction between said third and fourth semiconductor layers,
   a fifth semiconductor layer of said second conductivity type having a substantially annular shape, surrounded by and radially spaced apart from said fourth semiconductor layer, diffused into said third semiconductor layer towards but not meeting said second semiconductor junction and forming a fourth semiconductor junction between said third and fifth semiconductor layers,
   a first substantially annular metallization partially overlapping said fifth semiconductor layer and extending therefrom towards but not meeting said fourth semiconductor layer forming an electrical connection between said fifth semiconductor layer and said third semiconductor layer,
   a second substantially annular metallization overlying said fourth semiconductor layer and forming an electrical contact thereto;
   a light translucent gate region in said third semiconductor layer inside said fifth semiconductor layer,
   means converging light from said light source on said gate region.

8. The radiation triggered thyristor of claim 7 wherein said means converging light from said light source is a self-focussing light guide.

9. The radiation triggered thyristor of claim 7 wherein said means converging light from said light source is a conical mirror.

10. The radiation triggered thyristor of claim 7 wherein said first conductivity type is p-type and said second conductivity type is n type.

11. A universal, monolithic semiconductor switch adapted to be triggered either by a light source or by an electrical signal comprising
   a first semiconductor portion having first and second switch terminals and a gate terminal,
   a second semiconductor portion connected in amplifying gate relationship with said first semiconductor portion, said second semiconductor portion having a light sensitive gate area,
   means for applying an electrical signal to said gate terminal of said first semiconductor portion, and
   means converging light from said light source onto said light sensitive area.

12. The universal, monolithic semiconductor switch of claim 11 wherein said first and second semiconductor portions comprise thyristors.

13. The universal, monolithic semiconductor switch of claim 11 further comprising a third semiconductor portion connected in serial amplifying gate relationship between said first and second semiconductor portions for providing additional amplification.

14. The universal, monolithic semiconductor switch of claim 13 wherein said third semiconductor portion includes a gate region, and means for applying an electrical signal thereto for turning on or inhibiting the turn on of said semiconductor switch.

* * * * *